US006708404B1

United States Patent
Gaku et al.

(10) Patent No.: US 6,708,404 B1
(45) Date of Patent: Mar. 23, 2004

(54) METHOD OF PRODUCING HIGH-DENSITY COPPER CLAD MULTI-LAYERED PRINTED WIRING BOARD HAVING HIGHLY RELIABLE THROUGH HOLE

(75) Inventors: Morio Gaku, Tokyo (JP); Nobuyuki Ikeguchi, Tokyo (JP); Yoshihiro Kato, Tokyo (JP); Hiroki Aoto, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 09/593,494

(22) Filed: Jun. 14, 2000

(30) Foreign Application Priority Data

Jun. 17, 1999 (JP) .......................... 11-171642
Jun. 17, 1999 (JP) .......................... 11-171644
Jun. 17, 1999 (JP) .......................... 11-171645

(51) Int. Cl.$^7$ ................................ H01K 3/10
(52) U.S. Cl. .............. 29/852; 29/846; 216/17; 216/18; 216/65; 216/78; 219/121.71; 427/97
(58) Field of Search ............... 29/846, 847, 852; 216/17, 18, 65, 67, 78; 219/121.61, 121.7, 121.71; 427/97, 99

(56) References Cited

U.S. PATENT DOCUMENTS 3,457,638 A * 7/1969 Johnson ................. 174/266
6,217,987 B1 * 4/2001 Ono et al. .............. 428/209
6,280,641 B1 * 8/2001 Gaku et al. ............... 29/852

FOREIGN PATENT DOCUMENTS

DE   31 03 986   9/1982
EP   0 943 392   9/1999

OTHER PUBLICATIONS

Kestenbaum et al., IEEE Transactions on Components, Hybrids, and Manufacturing Technology, vol. 13, No. 4, pp. 1055–1062 (1990) Document No. XP000176849.

* cited by examiner

Primary Examiner—Richard Chang
(74) Attorney, Agent, or Firm—Wenderoth, Lind & Ponack, LLP

(57) ABSTRACT

A method of making a high-density copper-clad multi-layered printed wiring board having a reliable through hole including providing a stacked assembly including three copper foil layers and at least two resin layers; providing an auxiliary material on a top surface of the stacked assembly and providing a backup sheet on a bottom surface of the stacked assembly to form an assembly; subjecting the top surface of the assembly to pulsed oscillation from a carbon dioxide laser to form at least one through-hole to produce a pulsed assembly; reducing the thickness of the front and reverse copper foil layers and simultaneously with reducing, removing copper foil burrs, to produce a cleaned assembly; and plating the cleaned assembly with copper to produce the high-density copper-clad multi-layered printed wiring board.

7 Claims, 5 Drawing Sheets

METHOD OF PRODUCING HIGH-DENSITY COPPER CLAD MULTI-LAYERED PRINTED WIRING BOARD HAVING HIGHLY RELIABLE THROUGH HOLE

FIELD OF THE INVENTION

The present invention relates to a high-density multi-layered printed wiring board having a hole having a diameter of 25 to 200 μm and having at least three copper foil layers, which printed wiring board comprises a copper-clad multi-layered board in which all connections between copper foil layers are done with a through-hole penetrating through each of the copper foil layers. Further, the present invention relates to a method of producing a printed wiring board by using a copper-clad board which is prepared by disposing a hole-making auxiliary material on a copper surface of a multi-layered board having at least three copper foil layers, processing a hole formation in the outer and internal copper foil layers by direct irradiation with a high-output carbon dioxide gas laser to form a penetration hole for a through hole. Thereafter, the internal and outer layer copper foil burrs are removed from the hole portions, by etching while at the same time, the outer copper foil layers on the front and reverse surfaces are etched two-dimensionally to remove parts of the outer copper foil layers to reduce the thickness of the outer copper foil layers. Copper plating is then carried out. Furthermore, the present invention relates to a method of producing a printed wiring board which uses a resin composition having a carboxyl group in its molecule as an auxiliary material for forming a hole.

The multi-layered printed wiring board obtained by the present invention has a small-diameter hole and is used mainly for a novel semiconductor plastic package as a high-density small-sized printed wiring board.

BACKGROUND OF THE INVENTION

In a high-density printed wiring board used for a semiconductor plastic package, a penetration hole for a through hole is conventionally made with a drill. In recent years, the through hole diameter is decreasing to 180 μm or less, and the diameter of the drill is therefore decreasing. When a hole having the above small diameter is made, the problem is that the drill bends or breaks or that the processing speed is low, due to the small diameter of the drill, which results in problems in productivity and reliability.

Further, when there is employed a method in which holes having the same size are made in copper foils on front and reverse surfaces through negative films according to a predetermined method, further, a copper foil having similar holes made by etching is disposed as an internal layer copper foil and a hole for a through hole reaching the front and reverse surfaces is made with a carbon dioxide gas laser, the problems are that the deviation of the position of the internal copper foil occurs and that the positions of the holes on the upper and lower surfaces deviate from each other so that a failure in connection occurs and it is difficult to form lands on the front and reverse surfaces.

Further, when a high-density printed wiring board is prepared, a generally known method is a photo via method and a laser via method. These methods are a "build-up" method in which each layer is connected to another layer with a blind via hole and laminated. In this method, upper and lower layers are built-up one stage by one stage so that process steps are complicated, workability is poor and the price of a board obtained according to this method is expensive. Further, when a high-density printed wiring board is prepared by the use of only a mechanical drill so as to arrange a hole-hole distance to be 100 to 150 μm, cracks of a glass fiber occur due to the drill and plating is impregnated so that anti-migration properties are poor.

SUMMARY OF THE INVENTION

It is an object of the present invention to provide a high-density printed wiring board comprising a copper-clad multi-layered board having excellent reliability, productivity and economic performance, which multi-layered board is obtained by making a hole in a multi-layered copper-clad board having at least three copper foil layers with a carbon dioxide gas laser, and a method of producing it.

It is another object of the present invention to provide a high-density printed wiring board which is free from the occurrence of failures such as a short circuit and a pattern breakage in the formation of front and reverse circuits, and a method of producing it.

It is further another object of the present invention to provide a high-density printed wiring board which is also excellent in electric insulation properties, anti-migration properties and heat resistance, and a method of producing it.

According to the present invention, there is provided a high-density multi-layered printed wiring board including a copper-clad multi-layered board having a hole having a diameter of 25 to 200 μm, and includes at least three copper foil layers, wherein at least one hole is made with a laser and all connections between copper foil layers are done with a through-hole perforating through each of the copper foil layers.

According to the present invention, there is provided a method of producing a multi-layered printed wiring board which comprises a copper-clad multi-layered board obtained by forming a penetration hole in a multi-layered board having at least three copper foil layers, by direct irradiation with an energy sufficient for removing the copper foil by means of the pulse oscillation of the carbon dioxide gas laser, wherein the copper-clad multi-layered board is obtained by disposing a coating or a sheet, of a resin composition layer containing 3 to 97% by volume of a least one powder selected from the group consisting of a metal compound powder which has a melting point of at least 900° C. and a bond energy of at least 300 KJ/mol, a carbon powder, and metal powder, as an auxiliary material for making a hole, on a copper foil surface or treating the copper foil surface to form a metal oxide. Thereafter, the resultant surface is directly irradiated with a carbon dioxide gas laser to form a hole penetrating through the copper foil of the front and reverse copper foil layers and of the internal copper foil layer(s), then dissolving and removing copper foil burrs from the front and reverse copper foil layers and from the internal copper foil layer(s) (copper foil burrs include copper foil that overhang on the penetration hole portion) with a chemical, and carrying out plating with copper.

According to the present invention, there is provided a method of producing a multi-layered printed wiring board according to the above method, wherein the auxiliary material for making a hole is prepared by disposing a coating or a sheet of a resin composition containing 3 to 97% by volume of at least one powder selected from the group consisting of a metal compound powder, a carbon powder and metal powder which have a melting point of at least 900° C. and a bond energy of at least 300 KJ/mol and having a carboxyl group in its molecule, on the copper foil surface.

DETAILED DESCRIPTION OF THE INVENTION

Figure 1A:
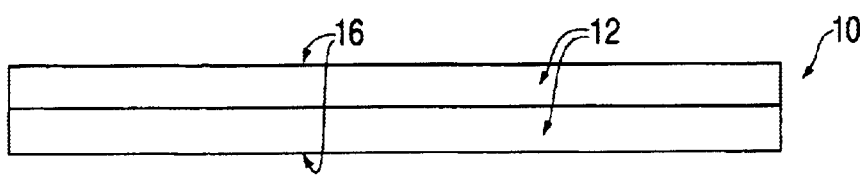
FIG. 1A illustrates a cross-section view of the double-sided copper-clad laminate of a preferred embodiment according to Example 1.

In the present invention, the following numbers are used to identify the elements of the preferred embodiments illustrated in the Figures and discussed in the Examples:

First Embodiment

The first embodiment corresponds to FIGS. 1 and 2, and is described in Example 1. The elements include: (8) varnish; (10) double-sided copper clad laminate; (12) prepreg; (14) prepreg; (16) copper foil layer; (18) circuits; (20) black copper oxide layer; (22) copper foil layer; (24) multi-layered board; (26) varnish; (28) film layer; (30) auxiliary material layer; (32) aluminum foil layer; (34) backup sheet; (36) laminate board; (38) penetration holes, 100 $\mu$m; (40) penetration holes, 150 $\mu$m; (42) copper foil burrs; (44) copper plating layer; (46) penetration holes partially filled with copper plating; (48) bonding pads; (50) solder ball; (52) plating resist; (54) printed wiring board; and (56) flip chip.

Second Embodiment

The second embodiment corresponds to FIG. 3, and is described in Example 3. The elements include: (110) double-sided copper clad laminate; (114) prepreg; (116) copper foil layer; (118) circuits; (120) black copper oxide layer; (122) copper foil layer; (124) four-layered board; (126) resin solution; (158) resin coating layer; (130) auxiliary material layer; (160) resin coating layer; (132) aluminum foil layer; (134) backup sheet; (138) penetration holes; (142) copper foil burrs; (162) coating-sheet-attached-four-layered-board; (164) treated board; (144) copper plating layer; and (154) printed wiring board.

The following numbers are used to identify the elements of prior art wiring boards illustrated in the Figures and discussed in the Examples:

First Comparative Example

The first comparative example corresponds to FIG. 4, and is described in Comparative Example 3. The elements include: (210) double-sided copper clad laminate; (212) prepreg; (214) prepreg; (216) copper foil layer; (218) circuits; (220) black copper oxide layer; (222) copper foil layer; (226) varnish; (266) mechanical penetration holes; (270) blind via holes; (244) copper plating layer without SUEP treatment; (268) laminate; (254) printed wiring board; and (256) flip chip.

The following numbers are used to identify the elements of prior art wiring boards illustrated in the Figures and discussed in the Examples:

Second Comparative Example

The second comparative example corresponds to FIG. 5, and is described in Comparative Example 5. The elements include: (310) double-sided copper clad laminate; (314) prepreg; (316) copper foil layer; (318) circuits; (320) black copper oxide layer; (322) copper foil layer; (324) four-layered board; (338) penetration holes 100 $\mu$m; (342) copper foil burrs; (372) etched holes; (374) position-deviated internal-layer copper foil; (376) copper plated penetration hole without SUEP treatment; (344) copper plating layer; and (354) printed wiring board.

The present invention relates to a high-density printed wiring board in which a double-sided copper-clad multi-layered board having at least three copper foil layers is provided with a penetration hole that penetrates through all of the copper foil layers and is used for a small-diameter through hole and a method of producing it. Further, the present invention relates to a high-density printed wiring board which is improved in connection with properties of a through hole by etching and removing overhanging burrs from internal copper foil layer(s) and from the front-and-reverse copper foil layers, such burrs being formed when a hole is made with a carbon dioxide gas laser, and carrying out copper plating, and a method of producing it.

The present invention provides a high-density printed wiring board which achieves the conduction of all the copper foil layers with a small-sized penetration hole, and a method of producing it. While the printed wiring board of the present invention is applicable to a wire-bonding mounting, it is particularly suitable for the mounting of a flip chip.

First, a multi-layered copper-clad laminate having at least three copper foil layers is prepared. A hole is made in a predetermined position in the above laminate. It is preferred to properly select a method of making a hole depending upon the diameter of a hole. When the diameter of a hole is 25 or more to less than 80 $\mu$m, an excimer laser or a YAG laser is used. When the diameter of a hole is 80 to 180 $\mu$m, an auxiliary material of an organic substance containing 3 to 97% by volume of at least one powder selected from the group consisting of a metal compound powder having a melting point of at least 900° C. and a bond energy of at least 300 KJ/mol, a carbon powder, and metal powder, where the auxiliary material is applied on a copper foil surface to form a coating which has a thickness of, preferably, 30 to 100 $\mu$m. Alternately, this resin is attached to a thermoplastic film so as to have the total thickness of, preferably, 30 to 200 $\mu$m, the resultant film is disposed on the copper foil surface with the attached-resin facing toward a copper foil side and, preferably, the resultant set is bonded by laminating. Otherwise, the copper foil surface is subjected to an oxidation treatment to form a metal oxide. The resultant surface is directly irradiated with a carbon dioxide gas laser having an energy preferably selected from 20 to 60 mJ/pulse to form a penetration hole for a through hole. When the diameter of a hole is 200 $\mu$m, a mechanical drill is preferably used for making a hole.

After the penetration hole is made with a carbon dioxide gas laser, the front-and-reverse copper foil layers may be mechanically polished to remove burrs. However, it is preferred to carry out etching with a chemical to remove burrs from the front and reverse copper foil layers and from the internal copper foil layer, together. When the front-and-reverse copper foil layers are thick, after the formation of a hole, the auxiliary material is removed, and the copper foil burrs of the front and reverse copper foil layers and of the internal copper foil layer, are then removed by etching, and at the same time the front-and-reverse copper foil layers are dissolved and removed partially in the thickness direction to reduce the thickness of the front-and-reverse copper foil layers to, preferably, 3 to 7 $\mu$m. When thin copper foils are used for the front-and-reverse copper foil layers, after the formation of a hole, the auxiliary material, i.e., resin coating or sheet is left as it is, and an etching solution is blown or sucked at a high rate to dissolve and remove copper foil burrs of the front and reverse copper foil layers and the internal copper foil layer. Then, the auxiliary material on the front and reverse surfaces is dissolved and removed with a solution in which the resin is soluble. In this case, the resin of the auxiliary material is selected from resins which are insoluble in the etching solution. As for the copper foil to be used, the use of a copper foil which preferably has an average particle diameter of 1 $\mu$m or less serves to make the formation of a hole with a carbon dioxide gas laser fine. Then, copper plating is carried out to obtain a double-sided copper-clad multi-layered board. Circuits are formed on the front and reverse surfaces of the double-sided copper-clad multi-layered board, and a printed wiring board is produced according to a general method. The front-and-reverse copper foil layers preferably have a thickness of 3 to 7 $\mu$m for forming minute circuits on the front and reverse surfaces. When the front-and-reverse copper foil layers are thin, it becomes possible to produce a high-density printed wiring board without failures such as a short circuit and a pattern breakage.

Further, an oxidation treatment may be carried out to form a metal oxide on a copper foil surface before the formation of a penetration hole. After oxidation, a hole can be made with a carbon dioxide gas laser, followed by removal of the copper foil burrs with a chemical, and the dissolution and removal of a partial thickness of the copper foil layers.

The processing rate using a carbon dioxide gas laser is remarkably high as compared with the processing rate achieved using a drill, and the method of the present invention is therefore excellent in productivity and excellent in economic performance. It is possible to make all penetration holes with an excimer laser, a YAG laser, a carbon dioxide laser or a mechanical drill. However, it is preferred to use the carbon dioxide gas laser having remarkably high processing speed effectively, and it is preferred to select a hole-forming machine depending upon each hole-diameter.

The multi-layered printed wiring board obtained by making penetration holes, particularly small-diameter holes, for through holes in a copper-clad multi-layered board having at least three copper foil layers, provided by the present invention, is mainly used for mounting a semiconductor chip. The multi-layered board used in the present invention is a multi-layered board having at least three copper foil layers which is obtained by making circuits on each layer, surface-treating copper foil layers thereof as required and laminate-forming the resultant set to integrate it. In predetermined positions of the multi-layered board, at least one penetration hole having a predetermined diameter, is made with a laser to achieve conduction through each of the layers, whereby a printed wiring board is obtained. In the printed wiring board of the present invention, the multi-layered board is not produced with only holes having a diameter of 200 $\mu$m but produced with a combination of at least two kinds of penetration holes having diameters different from each other. As a substrate having copper foil layers, which is the multi-layered board having at least three copper foil layers in the present invention, a base-reinforced substrate, a film-base substrate, a substrate formed of only a resin without a reinforcing base, etc., may be used. However, a copper-clad multi-layered board formed of a glass fabric substrate is preferred from the viewpoint of, for example, dimensional shrinkage. Further, when high-density circuits are prepared, 3 to 7 μm thick copper foils are provided for the surface copper foil layers from the beginning, or thick copper foils having a thickness of 9 to 18 μm are provided and subjected to laminate-formation and then the thick surface copper foil layers are treated with an etching solution such that the thickness of the surface copper foil layers is reduced to a thickness of 3 to 7 μm. When thin copper foils are used from the beginning, copper foils with a copper or aluminum carrier are mainly used.

In the present invention, an auxiliary material for making a hole with a carbon dioxide gas laser is preferably used by bonding it on the copper-clad multi-layered board at the time of making a hole. Generally, a solution of an auxiliary material is applied to a copper foil surface and dried to obtain a coating. Alternately, a varnish is applied to a thermoplastic resin and dried to obtain a sheet thereof, and the obtained sheet is used. The sheet is placed on the copper-clad multi-layered board with the resin-bonded surface facing a copper foil side and the resultant set is laminated under heat and pressure. Otherwise, after the resin surface is wetted 3 μm or less deep with water, sheets having the resin surface wetted are laminated on the front and reverse surfaces of the copper-clad multi-layered board at room temperature under pressure, whereby adhesion to a copper foil surface becomes excellent and a printed wiring board having holes in an excellent form can be obtained.

A generally known organic or inorganic woven fabric or non-woven fabric may be used as a substrate for the copper-clad board. Specifically, the inorganic fiber includes fibers of E glass, S glass, D glass and M glass. Further, the organic fiber includes fibers of a wholly aromatic polyamide, a liquid crystal polyester and polybenzazole. These may be mixtures. Preferably, a glass fiber woven fabric is used.

The resin of the thermosetting resin composition of the copper-clad multi-layered board used in the present invention can be selected from generally known thermosetting resins. Specific examples of the resin include an epoxy resin, a polyfunctional cyanate ester resin, a polyfunctional maleimide-cyanate ester resin, a polyfunctional maleimide resin and an unsaturated-group-containing polyphenylene ether resin. These resins are used alone or in combination. In view of the form of a through hole formed by processing by irradiation with a high-output carbon dioxide gas laser, it is preferred to use a thermosetting resin composition having a glass transition temperature of at least 150° C. In view of humidity resistance, anti-migration properties and electric characteristics after moisture absorption, it is preferred to use a polyfunctional cyanate ester resin composition. Further, for improving the form of a hole, a generally-known inorganic filler is added, and further, it is preferred to add a black dye or pigment.

A polyfunctional cyanate ester compound which is a suitable thermosetting resin component in the present invention refers to a compound having a least 2 cyanato groups per molecule. Specific examples thereof include 1,3- or 1,4-dicyanatobenzene, 1,3,5-tricyanotobenzene, 1,3-, 1,4-, 1,6-, 1,8-, 2,6-, or 2,7-dicyanatonaphthalene, 1,3,6-tricyanatonaphthalene, 4,4-dicyanatobiphenyl, bis(4-dicyanatophenyl)methane, 2,2-bis(4-cyanatophenyl)propane, 2,2-bis(3,5-dibromo-4-cyanatophenyl)propane, bis(4-cyantophenyl)ether, bis(4-cyanatophenyl)thioether, bis(4-cyanotophenyl)sulfone, tris(4-cyanatophenyl)phosphite, tris(4-cyanatophenyl)phoshpate, and cyanates obtained by a reaction between novolak and cyan halide.

In addition to the above compound, there may be used polyfunctional cyanate ester compounds disclosed in Japanese Patent Publications Nos. 41-1928, 43-18468, 44-4791, 45-11712, 46-41112 and 47-26853, and JP-A-51-63149. Further, a prepolymer having a molecular weight of 400 to 6,000 and having a triazine ring formed by trimerizing a cyanto group of any one of these poly functional cyanate ester compounds, may be used. The above prepolymer is obtained by polymerizing the above polyfunctional cyanate ester monomer in the presence of an acid such as a mineral acid or a Lewis acid, a base such as sodium alcoholate or tertiary amine, or a salt such as sodium carbonate, as a catalyst. The prepolymer partially contains unreacted monomer and is in the form of a mixture of a monomer and a prepolymer, and the prepolymer in the above form is also suitably used in the present invention. Generally, it is dissolved in an organic solvent in which it is soluble, before use.

The epoxy resin is generally selected from known epoxy resins. Specific examples thereof include a liquid or solid bisphenol A type epoxy resin, a bisphenol F type epoxy resin, a phenol novolak type epoxy resin, a cresol novolak type epoxy resin, an alicyclic epoxy resin, a polyepoxy compound obtained by epoxidizing the double bond of butadiene, pentadiene, vinylcyclohexene or dicyclopentyl ether, a polyol, and a polyglycidyl compound obtained by a reaction between a hydroxyl-group-containing silicone resin and epohalohydrin. These resins may be used alone or in combination.

The polyimide resin is generally selected from known polyimide resins. Specific examples thereof include reaction products from polyfunctional maleimides and polyamines, and polyimides having terminal triple bonds, disclosed in JP-B-57-005406. The above thermosetting resins may be used alone, while it is preferred to use them in a proper combination by taking account of a balance of properties.

Various additives may be added to the thermosetting resin composition in the present invention so long as the inherent properties of the composition are not impaired. The above additives include monomers having polymerizable double bonds such as unsaturated polyester, prepolymers of these, liquid elastic rubbers having a low molecular weight or elastic rubbers having a high molecular weight such as polybutadiene, epoxidized butadiene, maleated butadiene, a butadiene-acrylonitrile copolymer, polychloroprene, a butadiene-styrene copolymer, polyisprene, butyl rubber, fluorine rubber and natural rubber, polyethylene, polypropylene, polybutene, poly-4-methylpentene, polystyrene, AS resin, ABS resin, MBS resin, styrene-isoprene rubber, a polyethylene-propylene copolymer, a 4-fluoroethylene-6-fluoroethylene copolymer, high-molecular-weight prepolymers or oligomers such as polycarbonate, polyphenylene ether, polysulfone, polyester and polyphenylene sulfide, and polyurethane. These additives are used as required. Further, various known additives such as an organic or inorganic filler, a dye, a pigment, a thickener, a lubricant, an anti-foamer, a dispersing agent, a leveling agent, a photo-sensitizer, a flame retardant, a brightener, a polymerization inhibitor and a thixotropic agent may be used alone or in combination as required. A curing agent or a catalyst is incorporated into a compound having a reactive group as required.

The thermosetting resin composition used in the present invention undergoes curing itself under heat. However, when it is poor in workability and economic performances, etc., due to its low curing rate, a known heat-curing catalyst may be incorporated into the thermosetting resin. The amount of the catalyst per 100 parts by weight of the thermosetting resin is 0.005 to 10 parts by weight, preferably 0.01 to 5 parts by weight.

The metal compound having a melting point of at least 900° C. and a bond energy of at least 300kJ/mol, used in an auxiliary material in the present invention, can be generally selected from known metal compounds. For example, oxides are used. The oxides include titanias such as titanium oxide, magnesias such as magnesium oxide, oxides of iron such as iron oxide, oxides of nickel such as nickel oxide, manganese dioxide, oxides of zinc such as zinc oxide, silicon dioxide, aluminum oxide, rare earth metal oxides, oxides of cobalt such as cobalt oxide, oxides of tin such as tin oxide and oxides of tungsten such as tungsten oxide. Further, non-oxides may be used. The non-oxides include generally known non-oxides such as silicon carbide, tungsten carbide, boron nitride, silicon nitride, titanium nitride, aluminum nitride, barium sulfate and rare earth metal sulfides. Further, carbon may be used. Also, various glasses which are mixtures of metal oxide powders may be also used. Further, a carbon powder may be used. Powders of simple substances of silver, aluminum, bismuth, cobalt, copper, iron, magnesium, manganese, molybdenum, nickel, palladium, antimony, silicon, tin, titanium, vanadium, tungsten and zinc or metal powders of alloys of these, may be used. These are used alone or in combination. The particle diameter of these is not specially limited, while it is preferably 1 µm or less.

When irradiated with a carbon dioxide gas laser, molecules are dissociated or melted to be dissipated. Preferred powders are therefore those which have no detrimental effect on a semiconductor chip or adhesion properties of a hole wall when they adhere to the hole wall, and the like. A powder containing Na, K or Cl ion is not preferred since it has a detrimental effect on the reliability of a semiconductor. The amount of the above powder used in the invention is 3 to 97% by volume, preferably 5 to 95% by volume. Preferably, the above powder is incorporated into a resin composition and homogeneously dispersed.

When high-density circuits are prepared, 3 to 7 µm thick copper foils are provided for the surface copper foil layers from the beginning, or thick copper foils having a thickness of 9 to 18 µm are provided and subjected to laminate-formation, and then, when thick copper foils are used the surface copper foil layers are treated with an etching solution such that the surface copper foil layers have a thickness of 3 to 7 µm. When thin copper foils are used from the beginning, copper foils with a copper or aluminum carrier are mainly used.

The resin used in an auxiliary material is preferably selected from water-soluble resins, when the front-and reverse copper foil layers are thick. Specifically, suitable water-soluble resins for use in the invention include, water-soluble polyester resins, acrylate resins, polyether resins, polyvinyl alcohol resins, and starch. Also, various additives may be included. The additives are selected and incorporated such that the additives are not dissolved or peeled off in an etching step.

When the thickness of the front-and-reverse copper foil layers of the copper-clad board is thin or 3 to 7 µm, the resin is selected from resins which are insoluble in an etching solution. After bonding the auxiliary material to a copper-clad multi-layered board, it is also possible to cure the resin with ultraviolet radiation, etc., so as not to dissolve in the etching solution. However, as a preferred resin composition, an acid resin composition which is insoluble in water but is soluble in an organic solvent, is used. After the formation of holes, the acid resin composition is left on the copper foil surfaces, and a generally known acid etching solution such as ferric chloride is then blown at a high pressure or the solution is sucked and passed through the interior of the holes to remove burrs of the front-and-reverse and internal copper foil layers, by etching. Then, acid resin layers on the front and reverse surfaces are dissolved and removed with alkaline solutions such as sodium hydroxide and sodium carbonate; ketones such as methyl ethyl ketone; alcohols such as methyl alcohol and ethyl alcohol and aromatic hydrocarbons such as xylene, which are organic solvents in which the resin is soluble. Thereafter, copper plating is carried out, and circuits are formed to complete a printed wiring board. When a thermoplastic film is attached, the film is peeled off after etching and the acid resin is dissolved and removed with an alkaline solution or an organic solvent. A resin which is soluble in the solvent, other than the acid resin composition, may be used. When the above resin is used, the resin layers on the front and reverse surfaces are dissolved and removed with an organic solvent after the formation of holes and the removal of burrs. Preferred auxiliary materials include acid resin compositions that can be removed with an alkaline aqueous solution, in view of the apparatus produced and workability.

The acid resin of an auxiliary material is not limited. Suitable acid resins include, a polyester resin having a carboxyl group in its molecule, and an acrylate resin. The acid etching solution is water-based in most cases, and the resin of an auxiliary material is selected form resins which are insoluble in water. Also in this case, various additives may be added to the acid resin, the additives are selected and incorporated such that the additives are not dissolved or peeled off with an acid etching solution in an etching step. It is also possible to bond the auxiliary material to a copper-clad multi-layered board and then cure it with ultra-violet rays.

The method of preparing the composition containing a metal compound powder, a carbon powder or a metal powder and a resin, and the method of forming it into a sheet, are not critical. The above methods include known methods such as a method of kneading materials without any solvent at a high temperature with a kneader and extruding the kneaded mixture in the form of a sheet to bond it to a thermoplastic film surface, and a method of dissolving a resin in a solvent, adding the above powder thereto, homogeneously mixing them with stirring, applying the mixture as a coating composition to a copper foil surface and drying it to form a coating layer, or applying it to a thermoplastic film surface and drying it to form a coating layer. The thickness is not limited. However, when the coating composition is applied, the thickness of the coating is preferably 30 to 100 µm. When the above composition is applied to a film to form a coating layer on the film, the total thickness is preferably from 30 to 200 µm.

When the above auxiliary sheet is laminated on a copper foil surface under heat and pressure, the applied resin layer side thereof is attached to the copper foil surface, and the auxiliary sheet is laminated on the copper foil surface with a roll by melting the resin layer at a temperature generally between 40° C. and 150° C., preferably between 60° C. and 120° C., at a linear pressure of generally 0.5 to 20 kgf/cm, preferably 1 to 10 kgf/cm, to attach the resin layer closely to the copper foil surface. The temperature to be employed differs depending upon the melting point of a selected water-soluble resin and also differs depending upon a selected linear pressure and a laminating rate. Generally, the lamination is carried out at a temperature higher than the melting point of the water-soluble resin by 5 to 20° C.

The metal oxide may be formed using generally known oxidation treatments. Further, treatment with a chemical may also be employed, e.g., Meck CZ treatment with CZ8000, supplied by Meck K.K.

The reinforced copper-clad multi-layered board is prepared as follows. First, the above reinforcing material is impregnated with the thermosetting resin composition, and the impregnated reinforcing material is dried to B-stage, whereby a prepreg is obtained. A predetermined number of the prepreg sheets are stacked, a copper foil layer is placed on at least one surface of the stacked prepreg sheets, and the resultant set is laminate-formed under heat and pressure to form a copper-clad multi-layered board having at least three copper foil layers. The copper foil outer layer preferably has a thickness of 3 to 12 $\mu$m and the copper foil internal layer has a thickness of 9 to 18 $\mu$m. While the kind of copper foil is not limited, an electrolytic copper foil composed of particles having an average particle diameter of 1 $\mu$m or less is preferred in view of adhesion. A copper-clad multi-layered board is used as the multi-layered board. The copper-clad multi-layered board is prepared by forming a circuit in a copper-clad laminate preferably having a reinforced base material, treating a copper foil surface, then, arranging a B-staged prepreg having a reinforced base material or a resin sheet having no base material, a copper foil layer having a resin layer attached thereto, the resin layer formed by coating at least one copper foil surface with a resin coating composition, placing a copper foil layer or copper foil layers on the outermost surface or surfaces, and laminate-forming the resultant set under heat and under pressure, preferably in a vacuum.

A metal oxide may be formed using a generally known treatment. Further, treatment with a chemical may also be employed, e.g., Meck CZ treatment with CZ8000, supplied by Meck K.K.

The reinforced copper-clad multi-layered board is prepared as follows. First, the above reinforcing material is impregnated with the thermosetting resin composition, and the impregnated reinforcing material is dried to B-stage whereby a prepreg is obtained. A predetermined number of the prepreg sheet are stacked, a copper foil layer is placed on at least one surface of the stacked prepreg sheets, and the resultant set is laminate-formed under heat and pressure to form a copper-clad multi-layered board having at least three copper foil layers. The copper foil outer layer preferably has a thickness of 3 to 12 $\mu$m and the copper foil internal layer has a thickness of 9 to 18 $\mu$m. While the kind of copper foil is not limited, an electrolytic copper foil composed of particles having an average particle diameter of 1 $\mu$m or less is preferred in view of adhesion. A copper-clad multi-layered board is used as the multi-layered board. The copper-clad multi-layered board is prepared by forming a circuit in a copper-clad laminate preferably having a reinforced base material, by treating a copper foil surface, then, arranging a B-staged prepreg having a reinforced base material or a resin sheet having nor base material, a copper foil layer having a resin layer attached thereto, the resin layer formed by coating at least one copper foil surface with a resin coating composition, placing a copper foil layer or copper foil layers on the outermost surface or surfaces, and laminate-forming the resultant set under heat and under pressure, preferably in a vacuum.

The surface where a coating or a sheet of the auxiliary material is provided is directly irradiated with a high-output carbon dioxide gas laser having a diameter focused to an intended diameter and having an energy preferably selected from 20 to 60 mJ/pulse to make holes in the copper foil layers. It is possible to irradiate the surface with an energy of 40 mJ/pulse to make holes in the copper foil layer, and then to irradiate a resin layer with a lower energy of 15 mJ/pulse to make holes in the resin layer. The energy is not limited, and it is properly selected depending upon the resin to be used and the substrate.

In the present invention, the method of removing the copper burrs occurring on the hole portions of the copper foil layers, by etching is not limited, and it includes methods of dissolving and removing a metal surface with a chemical (called a SUEP method) disclosed, for example, in JP-A-02-22887, JP-A-02-22896, JP-A-02-25089, JP-A-02-25090, JP-A-02-59337, JP-A-02-60189, JP-A-02-166789, JP-A-03-25995, JP-A-03-60183, JP-A-03-94491, JP-A-04-199592, and JP-A-04-263488. The etching is generally carried out at a rate of 0.02 to 1.0 $\mu$m/second. When the copper foil burrs of the internal copper foil layer are removed by etching, the blowing angle and pressure of the etching solution are properly selected. Further, copper foil burrs may also be removed using a method including passing a solution through the penetration holes by means of suction to dissolve the copper foil burrs.

A carbon dioxide gas laser generally uses a wavelength of 9.3 to 10.6 $\mu$m in an infrared wave length region. While the output thereof is not specially limited, the copper foil layers and an insulation layer are processed by irradiation with required pulses (shots) by means of a pulse oscillation preferably at an energy of 20 to 60 mJ/pulse to make holes. Any irradiation method may be used to make a penetration hole i.e., a method in which irradiation with an energy selected from 20 to 60 mJ/pulse is carried out from beginning to end, and a method in which a hole is made in the copper foil layer and then the insulation layer is processed with a decreased energy.

A metal sheet can be placed on the reverse surface of a multi-layered board for preventing damage to the table of a laser machine, which damage is caused by the laser when penetrating a copper foil layer to form a hole. When the front-and-reverse copper foil layers are thin, preferably, a resin layer is bonded to the reverse-surface copper foil layer of a copper-clad multi-layered board, and a metal sheet is preferably disposed thereon with part of the metal sheet bonding to the resin. Thereafter, penetration holes for through holes are made, then, the metal sheet is peeled off, copper foil burrs in circumferential regions of the holes on the front and reverse surfaces and internal copper foil burrs are removed by etching while retaining the resin layers on the front and reverse surfaces. Subsequently, the resin layers are dissolved and removed. When the front-and-reverse copper foil layers are thick, the auxiliary material on the front and reverse surfaces of the board or metal oxide formed by oxidation treatment, is removed after the formation of holes, and etching is carried out.

An excimer laser generally uses a wavelength of 248 to 308 nm. A YAG laser generally uses a wavelength of 351 to 355 nm. Thus, holes can be made in a copper foil layer with, for example, a YAG laser or a mechanical drill at the beginning, and then holes can be made in a resin layer with a carbon dioxide gas laser. The method of processing holes is not limited. Further, the wavelength is not necessarily limited.

In most cases, a resin layer having a thickness of about 1 $\mu$m remains on the internal surfaces of the front and reverse copper foil layers and the internal copper foil layer in the inside of the processed hole. The above resin layer can be removed according to a known treatment such as a desmear treatment before etching. When, however, a solution does not reach to the inside of a small-diameter hole, resin may remain on the surface of the internal copper foil layer, which can cause the copper plating to fail to adhere to the internal surface of the hole. Therefore, preferably, the inside of a hole is first treated in a gaseous phase to remove the remaining resin layer completely, thereafter copper foil burrs are removed from the inside of the hole and from the front and reverse copper foil layers, by etching.

The gaseous phase treatment can be selected from known methods such as plasma treatment and treatment with low-pressure ultraviolet light. The plasma treatment uses low-temperature plasma prepared by partially exciting and ionizing molecules with a high-frequency power source. In the plasma treatment, a high-rate treatment using ionic impact or a moderate treatment with radical species is generally used. As a processing gas, a reactive gas or an inert gas is used. Preferable reactive gases for use, include oxygen. A surface is chemically treated. Preferable inert gases for use, include argon. Physical surface treatment is carried out with argon gas, or the like. The physical treatment physically cleans a surface with an ionic impact. The low-pressure ultraviolet light is ultraviolet light in a short wavelength region. A resin layer is decomposed and removed by irradiation with ultraviolet light in a short wavelength region having a peak at 184.9 nm or 253.7 nm. While the inside of a hole may be treated by a general copper plating, part, preferably at least 80% by volume, of the inside of a hole may be filled with copper plating.

According to the present invention, a through hole penetration hole is made without deviation of the hole from the front surface through to the reverse surface of the copper-clad board, at a remarkably higher rate as compared with the processing rate achieved using a mechanical drill, and productivity is also remarkably improved. Copper foil layers on both surfaces are two-dimensionally etched to remove a partial thickness of the copper foil layers as raw materials, whereby copper foil burrs occurring in hole portions are concurrently etched and removed. Thus, resulting in a high-density printed wiring board having excellent reliability, which is free from problems including, the occurrence of short circuits, and pattern breakage which can occur when front-surface and reverse-surface circuits are formed by copper plating

EXAMPLES

The present invention will be explained more in detail with reference to Examples and Comparative Examples hereinafter, in which "part" stands for "part by weight" unless otherwise specified.

Example 1

900 parts of 2,2-bis(4-cyanatophenyl)propane and 100 parts of bis(4-maleimidephenyl)methane were melted at 150° C. and allowed to react for 4 hours with stirring, to prepare a prepolymer. The prepolymer was dissolved in mixed solvents of methyl ethyl ketone and dimethylformamide. To this solution, 400 parts of a bisphenol. A type epoxy resin (trade name: EPIKOTE 1001, Supplied by Yuka-Shell Epoxy K.K.) and 600 part of a cresol novolak type epoxy resin (trade name: ESCN-22F, supplied by Sumitomo Chemical Co., Ltd.), were added. These materials were then homogeneously dissolved and mixed. 0.4 parts of zinc octylate were then added as a catalyst, and these materials were dissolved and mixed. To the resultant mixture, 500 parts of an inorganic filler (trade name: Calcined Talc, supplied by Nippon Talc K.K.) and 8 parts of a black pigment, were then added. These materials were then homogeneously stirred and mixed to prepare a varnish (8).

The above varnish (8) was used to impregnate a 100 $\mu$m thick glass woven fabric, and the impregnated glass woven fabric was dried at 150° C. to prepare prepreg (12) having a gelation time of 120 seconds at 170° C. and having a glass fabric content of 56% by weight. Further, prepreg (14) was prepared, having a glass content of 44% by weight.

Figure 1B:
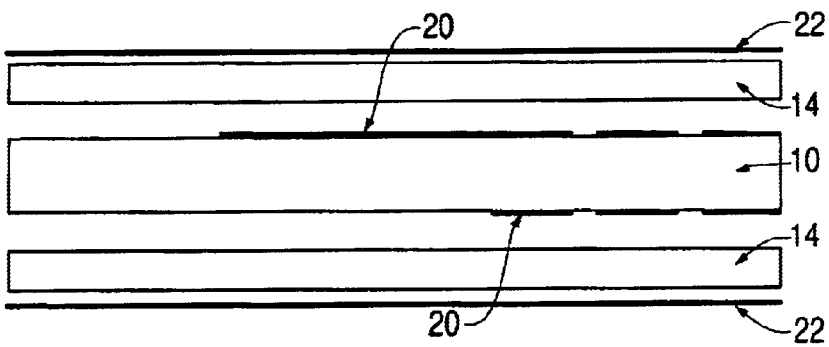
FIG. 1B illustrates a cross-section view of the laminate of FIG. 1A having circuits provided on its upper and lower surface, and having two prepregs, one disposed at the upper surface and one disposed at the lower surfaces of the laminate, prepregs including glass fabric impregnated with a varnish. A copper foil layer is provided at the top surface of the upper prepreg and at the bottom surface of the lower prepreg, to form a construct.
Figure 1C:
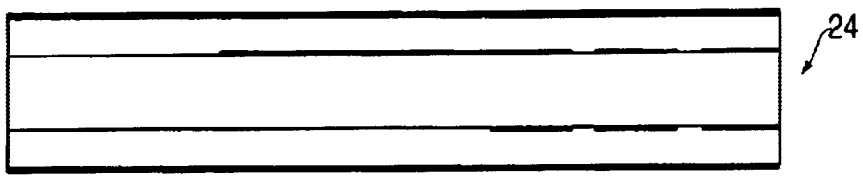
FIG. 1C illustrates a cross-section view of the construct of FIG. 1B, laminate-formed to produce a four layered board.

Two sheets of the prepreg (12) were stacked, 12 $\mu$m thick electrolytic copper foil layers (16) having an average copper-particle diameter of 0.5 $\mu$m were placed on the upper and lower surfaces of the stacked prepregs, one on the upper surface, and the other on the lower surface, and the resultant set was laminate-formed at 200° C. at 20 kgf/cm$^2$ under a vacuum of 30 mmHg or less for 2 hours, to obtain a double-sided copper-clad laminate (10) having an insulation layer thickness of 200 $\mu$m (FIG. 1A). Circuits (18) were formed on the front and reverse surfaces of the laminate (10), the surfaces of the copper foil layers (16) were treated to form black copper oxide (20). Prepregs (14) were placed on the upper and lower surfaces of laminate (10), one on the upper surface, and one on the lower surface, and 12 $\mu$m thick electrolytic copper foil layers (22) having an average copper-particle diameter of 0.3 $\mu$m were placed thereon, and the resultant set was similarly laminate-formed to obtain a multi-layered board (24) having four layers (FIGS. 1B and 1C).

Figure 1D:
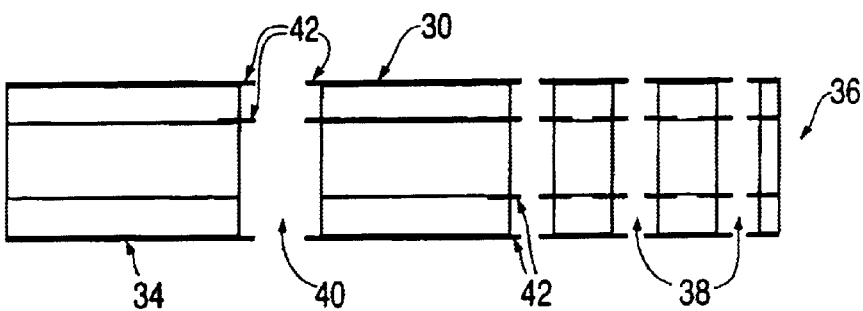
FIG. 1D illustrates a cross-section view of the four layered board of FIG. 1C having auxiliary material provided on the top surface of the board, and a backup sheet provided on the bottom surface of the board, where the resultant board includes penetration holes formed by irradiation traversing the board, and includes copper foil burrs extending from and into the holes.

Separately, 800 parts of a copper oxide powder (average particle diameter: 0.9 $\mu$m) as a metal compound powder, were added to a varnish of polyvinyl alcohol in water, and these materials were homogeneously stirred and mixed to obtain the final varnish (26). The varnish (26) was applied to one surface of a 50 $\mu$m thick polyethylene terephthalate film (28) to form a coating having a thickness of 25 $\mu$m, and the coating was dried to obtain an auxiliary material (30) having a metal compound content of 35% by volume. The above final varnish (26) was applied on a 50 $\mu$m thick aluminum foil (32), to form a coating having a thickness of 25 $\mu$m, and the coating was dried to obtain a backup sheet (34) for the reverse surface. The auxiliary material (30) was disposed on the upper surface of the laminate (24), the backup sheet (34) was disposed on the lower surface of the laminate (24), and the resultant set was laminated at 100° C. under a pressure of 2 kgf/cm$^2$ to form laminate board (36). The above laminate upper surface was irradiated directly by pulsing once with a carbon dioxide gas laser at an output of 40 mJ/pulse, and then irradiated by pulsing six times at an output of 28 mJ/pulse, to form 144 penetration holes (38) having a diameter of 100 $\mu$m each for through holes in each of 70 blocks in a central flip-chip-mounting portion having a size of 6 mm×6 mm in a 50 mm×50 mm square area. On the other hand, 100 penetration holes (40) having a diameter of 150 $\mu$m were similarly made in a circumferential region of the flip-chip-mounting portion with a carbon dioxide gas laser (FIG. 1D).

Figure 2A:
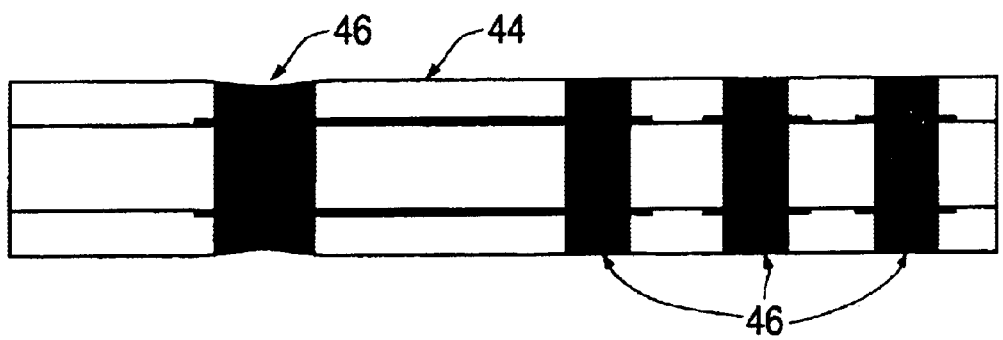
FIG. 2A illustrates a cross-section view of the board of FIG. 1D having the auxiliary layer removed, having the copper foil layers partially removed, having the copper foil burrs removed, and being plated with copper where the volume of each penetration-hole is partially filled, to form a plated board.

The resin layer of the auxiliary material (30) on the front surface was peeled off, then, the resultant board was placed in a plasma apparatus and treated. Thereafter, a SUEP solution was sucked at a high rate to reduce the thickness of the front and reverse copper foil layers (22) to 4 $\mu$m, and at the same time to dissolve and remove copper foil burrs (42) of the internal and outer copper foil layers. After desmear treatment, copper was plated on the resultant board to form a 15 $\mu$m thick copper plating layer (44). At the same time, 93% by volume of the inside of each hole (38) and (40) was filled (46) with copper plating (FIG. 2A). Then, circuits (18)

Figure 2B:
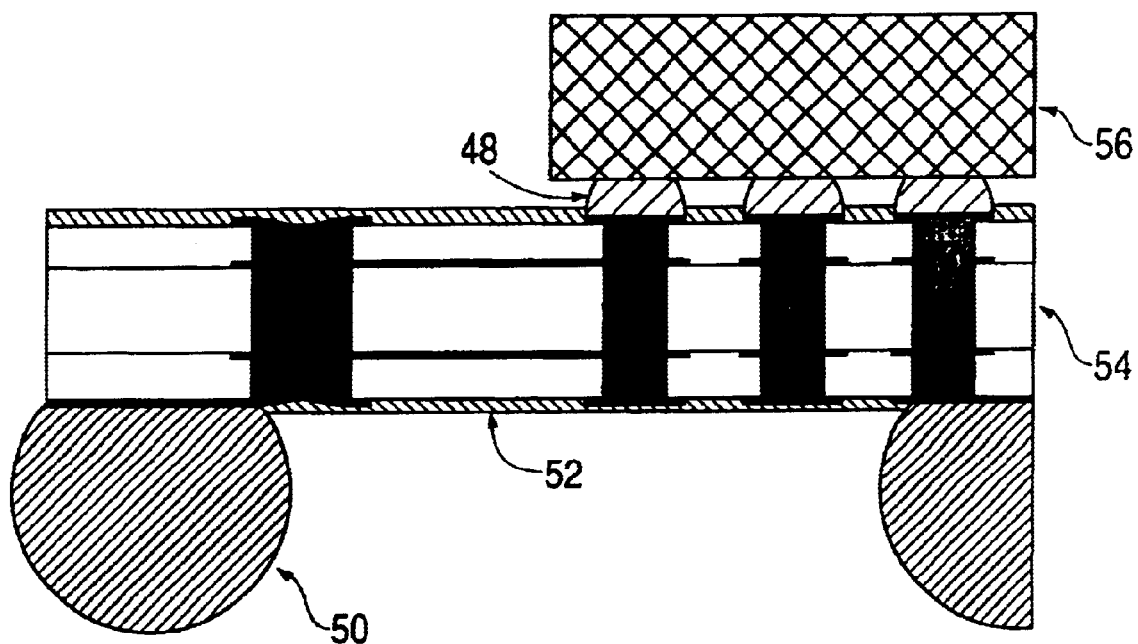
FIG. 2B illustrates a cross-section view of a semiconductor plastic package including the plated board of FIG. 2A having provided thereon bonding pads, being coated with a plating resist to form a printed wiring board, and having a flip chip and solder balls provided on the wiring board to form the semiconductor plastic package.

(144, line/space=70/70 μm), bonding pads (48) and pads for solder balls, etc., were formed according to a conventional method, portions other than at least the bonding pads (48) and the solder ball pads were coated with a plating resist (52), and nickel plating and gold plating were carried out to obtain a printed wiring board (54). A flip chip (56) was mounted on the printed wiring board (54), and solder balls were bonded to the reverse surface to obtain a semiconductor plastic package (FIG. 2B). Tables 1 and 2 show the evaluation results for the resultant printed wiring board.

Example 2

A metal compound powder ($SiO_2$: 57 wt %; MgO: 43 wt %, average particle diameter: 4 μm) was added to a solution of carboxyl-group-containing polyester resin having a melting point of 67° C. and an acid value of 71 mgKOH/g in n-butanol, and these materials were homogeneously mixed and stirred to obtain a varnish.

Separately, one prepreg which was the same as the prepreg in Example 1 was used, 12 μm thick electrolytic copper foil layers having an average particle diameter of 1 μm, were placed on the upper and lower surfaces of the prepreg, and the resultant set was similarly laminate-formed, to give a double-sided copper-clad laminate. Circuits were formed on the front and reverse surfaces of the obtained board, and then, the surfaces were treated to form a black copper oxide layer. Then, sheets of the above prepreg were placed on the upper and lower surfaces of the laminate, one sheet on the upper surface and one sheet on the lower surface, 7 μm thick electrolytic copper foil layers were placed thereon, and the resultant set was similarly laminate-formed to obtain a four-layered board. In a circumferential region of a central flip-chip-mounting portion having a 6 mm×6 mm square size, holes having a diameter of 200 μm were made with a mechanical drill, and a hole-filling resin (trade name; BT-S730B, supplied by Mitsubishi Gas Chemical Company, INC.) was filled therein and cured at 110° C. for 1 hour and then at 160° C. for 3 hours, and then, resins remaining on the surfaces were removed by polishing.

Separately, the above varnish was applied to the front and reverse surfaces of the four-layered board and dried to form coatings having a thickness of 50 μm, a release agent-attached aluminum was disposed on the outer side of the reverse surface. The board surface was then irradiated with five pulses from a carbon dioxide gas laser at an output of 35 mJ/pulse, to make penetration holes having a diameter of 100 μm each, in the same form in which the penetration holes penetrated through the internal copper foil layer in Example 1. The aluminum was peeled off while retaining the resin layer on the reverse surface. While retaining the auxiliary sheets on the front and reverse surfaces, hole portions where the holes had been formed were blown with an acid etching solution at a high rate, to remove copper foil burrs of the surface layers and the internal layers. Then, the acid polyester resin on the front and reverse surfaces was dissolved and removed with a sodium hydroxide aqueous solution, and treated with a potassium permanganate aqueous solution. Copper plating was then carried out. Ball pads were formed on plated portions on the above holes having a diameter of 200 μm each to obtain a printed wiring board. A flip chip was mounted and solder balls were bonded to form a semiconductor plastic package. Tables 1 and 2 show the evaluation results for the printed wiring board.

Comparative Example 1

The same double-sided copper-clad laminate as that in Example 2 was provided, without any material attached to the surface of the laminate. Using the method set forth in Example 2, attempts were made to make holes in the laminate using a carbon dioxide gas laser as set forth in Example 2. No holes were made.

Comparative Example 2

The same multi-layered board as that in Example 1, was provided. The copper foil on the front surface was blackened with a magic marker. The blackened surface was irradiated with the same number of pulses from a carbon dioxide gas laser as set forth in Example 1, at an energy of 40 mJ/pulse, in order to make holes having a diameter of 100 μm. No holes were made in the copper foil.

Comparative Example 3

Figure 4A:
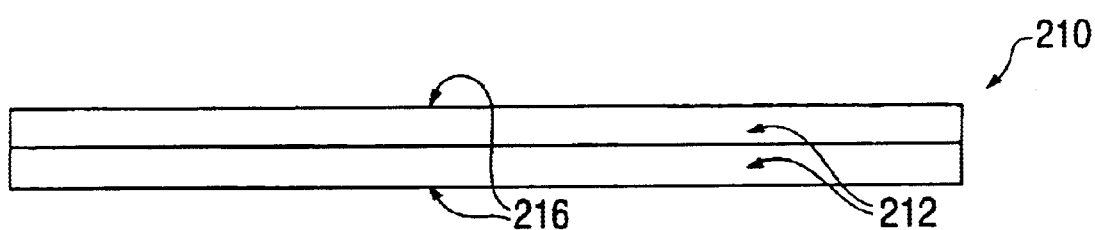
FIG. 4A illustrates a cross-section view of a double-sided copper-clad laminate of the prior art board of Comparative Example 3, produced by layering two prepregs to form a prepreg construct, providing a copper foil layer on the top surface and on the bottom surface of the construct, and laminating the resultant construct to form the double-sided copper-clad laminate.
Figure 4B:
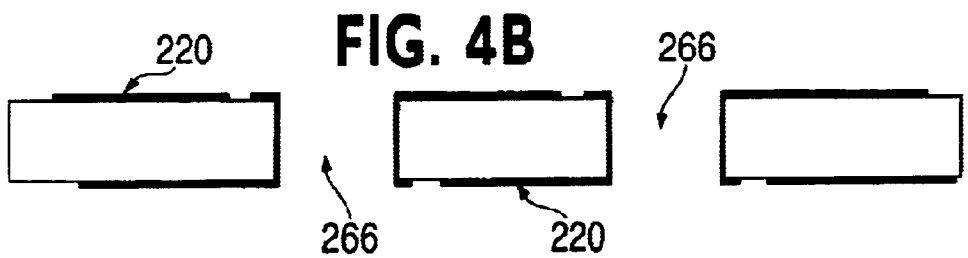
FIG. 4B illustrates a cross-section view of the laminate of FIG. 4A having through-holes mechanically drilled therethrough, a copper plating layer, and circuits formed on both surfaces of the laminate.
Figure 4C:
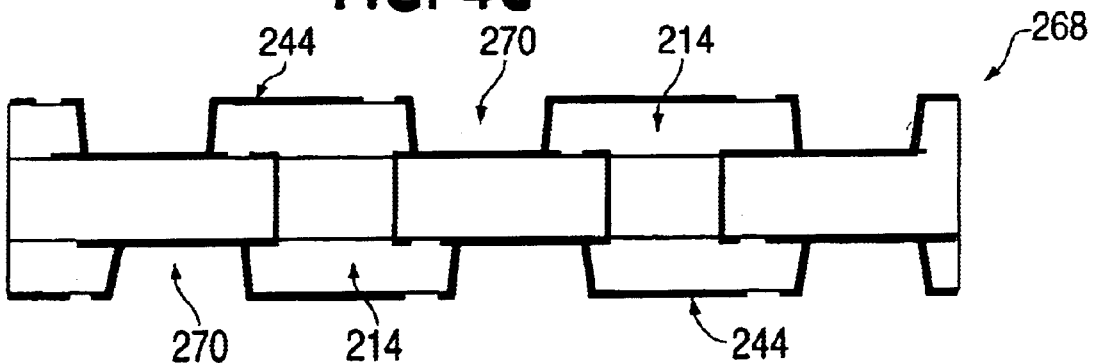
FIG. 4C illustrates a cross-section of the printed wiring board having blind via holes, of Comparative Example 3, produced by placing the laminate of FIG. 4B treated to form black copper oxide, between two prepregs to form a construct, providing a copper foil layer on the top and bottom surfaces of the construct, laminating the resultant construct, and forming via holes using a carbon dioxide gas laser, on the laminated construct (without SUEP treatment).

2,000 parts of an epoxy resin (trade name: EPIKOTE 5045), 70 parts of dicyandiamide and 2 parts of 2-ethylimidazole, were dissolved in mixed solvents of methyl ethyl ketone and dimethyl formamide, and 800 parts of the same insulating inorganic filler as that in Example 1 was added. These materials were uniformly dispersed with stirring to obtain a varnish (226). The varnish was used to impregnate a 100 μm thick glass woven fabric and dried to obtain prepreg (212) having a gelation time of 140 seconds (at 170° C.) and a glass content of 55% by weight and prepreg (214) having a gelation time of 180 seconds and a glass content of 43% by weight. Two sheets of the prepreg (212) were used. 12 μm thick electrolytic copper foil layers (216) having an average particle diameter of 3 μm were placed on both surfaces. The resultant set was laminate-formed at 190° C. at 20 kgf/cm² under a vacuum of 30 mmHg or lower for 2 hours, to form a double-sided copper-clad laminate (210) (FIG. 4A). Mechanical penetration holes (266) having a diameter of 250 μm each were made in the above laminate (210) with a mechanical drill having a drill diameter of 250 μm. After desmear treatment, copper plating was carried out to form a plating layer (244) of 15 μm, and circuits (218) were formed on both the surfaces of the laminate (FIG. 4B). The resultant laminate was treated to form a black copper oxide layer (220), then, sheets of prepreg (214) were placed on both the surfaces, one sheet on the upper surface and one sheet on the lower surface thereof, copper foil layers (222) having a thickness of 12 μm and an average particle diameter of 3 μm were placed thereon, and the resultant set was laminate-formed to form laminate (268). 144 holes having a diameter of 150 μm each for forming blind via holes (270) were made within a semiconductor-chip-mounting area on the front surface and on a corresponding area on the reverse surface which have a 6 mm×6 mm square size, by the removal of the copper foil by means of etching. The surface was irradiated by pulsing three times with a carbon dioxide gas laser at an energy of 15 mJ/pulse to form 100 via holes (270) having the same diameter in a circumferential region of the semiconductor flip-chip-mounting portion and a corresponding circumferential region on the reverse surface. Then, desmear treatment was carried out without SUEP treatment and without a gaseous phase treatment, and a general copper plating was carried out to form copper plating layer (244), thereby producing a printed wiring board (254). (FIG. 4C). A flip chip (256) was mounted to obtain a semiconductor plastic package. Tables 1 and 2 show the evaluation results for the printed wiring board.

Comparative Example 4

The same multi-layered board of Example 1, was provided, and penetration holes were similarly made with a mechanical drill having a drill diameter of 250 μm at 100,000 rpm. One desmear treatment was carried out without SUEP treatment, followed by copper plating according to a general method to form a copper plating layer, to complete a printed wiring board. Tables 1 and 2 show the evaluation results for the printed wiring board.

Comparative Example 5

Figure 5A:
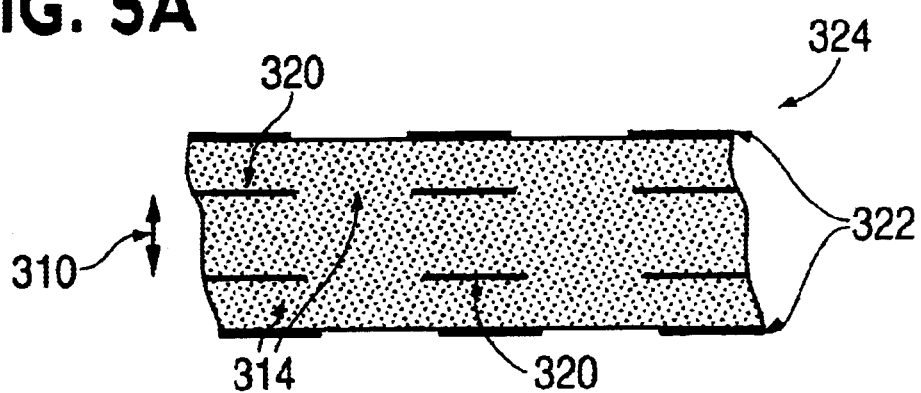
FIG. 5A illustrates a cross-section view of the multi-layered board of the prior art board of Comparative Example 5.
Figure 5B:
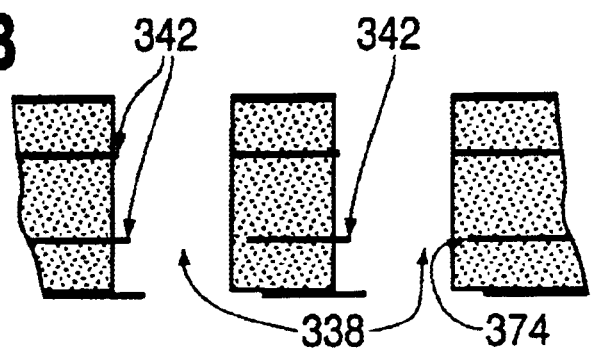
FIG. 5B illustrates a cross-section view of the multi-layered board of FIG. 5A having penetration holes therethrough, copper foil burrs extending from and into the holes, and position-deviated internal-layer copper foil.
Figure 5C:
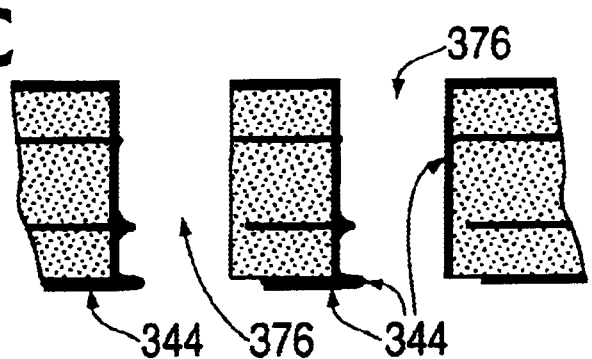
FIG. 5C illustrates a cross-section view of the board of FIG. 5B having penetration holes and being copper plated without SUEP treatment.

The double-sided copper-clad laminate (310) of Example 1, was used. Portions of the copper foil layers (316) where through holes of internal layers were to be formed on the front and reverse surfaces of the laminate (310) were etched so as to have a hole diameter of 100 μm (372). Circuits (318) were then formed. Thereafter, the copper foil surfaces of the copper foil layers (316) were treated to form black copper oxide layers (320). Sheets of prepreg (314) were then placed thereon, 12 μm thick electrolytic copper foil layers (322) having an average particle diameter of 3 μm were placed on prepregs (314), and the resultant set was laminate-formed under the same conditions as those set forth in Example 1, to prepare a four-layered board (324) (FIG. 5A). This multi-layered board was used, and holes having a diameter of 100 μm were made in positions where penetration holes were to be formed on the front surface by etching the copper foil. Similarly, penetration holes having a diameter of 100 μm were also made in the same positions on the reverse surface. The front surface was irradiated by pulsing six times with a carbon dioxide gas laser at an output of 15 mJ/pulse to form penetration holes (338) for through holes (FIG. 5B). FIG. 5B illustrates copper foil burrs (342) and position-deviated internal-layer copper foil (374). Thereafter, one desmear treatment was carried out without SUEP treatment in the same manner as set forth in Comparative Example 4. Copper plating was then carried out to form a 15 μm thick copper plating layer (344) (FIG. 5C), resulting in copper plated penetration holes without SUEP (376). Circuits (318) were then formed on the front and reverse surfaces, whereby a printed wiring board (354) was obtained. Tables 1 and 2 show the evaluation results for the printed wiring board.

TABLE 1

|  | Ex. 1 | Ex. 2 | CEx. 3 | CEx. 4 | CEx. 5 |
|---|---|---|---|---|---|
| Deviation of land copper foils on the front and reverse surfaces (μm) | 0 | 0 | — | 0 | 27 |
| Deviation of hole positions from the internal layer (μm) | 0 | — | — | 0 | 35* |
| Pattern breakage and short circuit (number) | 0/200 | 0/200 | 51/200 | 55/200 | 57/200 |
| Copper foil hiatuses around land | Nil | Nil | Nil | Nil | Yes |
| Glass transition temperature (° C.) | 235 | 235 | 139 | 235 | 235 |
| Through hole and via hole-heat cycle test (%) | | | | | |
| 100 cycles | 1.1 | 1.3 | 3.7 | 1.1 | 2.9 |
| 200 cycles | 1.3 | 1.5 | 8.9 | 1.3 | 4.5 |
| Processing time period for making holes (minute) | 21 | — | — | 630 | — |

Ex. = Example, CEX. = Comparative Example

TABLE 2

|  | Ex. 1 | Ex. 2 | CEx. 3 | CEx. 4 | CEx. 5 |
|---|---|---|---|---|---|
| Migration resistance (HAST) (Ω) | | | | | |
| Ordinary state | $2 \times 10^{11}$ | — | $1 \times 10^{11}$ | $2 \times 10^{11}$ | |
| 200 hours | $8 \times 10^{8}$ | | | $<10^{8}$ | $7 \times 10^{8}$ |
| 500 hours | $8 \times 10^{8}$ | | | — | $<10^{8}$ |
| 700 hours | $7 \times 10^{8}$ | | | | |
| 1000 hours | $6 \times 10^{8}$ | | | | |
| Insulation resistance (Ω) after pressure cooker treatment | | | | | |
| Ordinary state | $5 \times 10^{14}$ | — | $6 \times 10^{14}$ | | |
| 200 hours | $6 \times 10^{12}$ | | | $<10^{8}$ | |
| 500 hours | $7 \times 10^{11}$ | | | — | |
| 700 hours | $4 \times 10^{10}$ | | | | |
| 1000 hours | $2 \times 10^{10}$ | | | | |

Ex. = Example, CEx. = Comparative Example

Measurement Methods

1) Deviation of Hole Positions on the Front and Reverse Surfaces, and Time Period for Making Holes In each of the Examples and Comparative Examples, 244 holes/block were made in 258 blocks (62,952 holes) with a laser and a mechanical drill. A time period required for making the holes in one copper-clad board and the maximum values of deviations between copper foils for lands on the front and reverse surfaces and holes and deviations of internal copper foils, were shown.

2) Circuit Pattern Breakage and Short Circuit

In the Examples and Comparative Examples, boards having no holes made were similarly prepared, comb-like patterns having a line/space=70/70 μm were prepared, and then 200 patterns were visually observed through a magnifier after etching. A numerator shows the total of patterns which had a circuit pattern breakage and a short circuit.

3) Glass Transition Temperature

Glass transition temperature was measured by a DMA method.

4) Heat-cycle Tests of Through Holes and Via Holes

A land having a diameter of 350 μm was formed in each through hole, and 900 holes were connected alternately from one surface to the other surface or from one upper via hole to one lower via hole. One heat cycle consisted of immersion for soldering at 260° C. for 30 seconds followed by standing at room temperature for 5 minutes. 200 cycles were performed. Table 1 shows the maximum value of change ratios of resistance values.

5) Copper Foil Breakage Around a Land

A land having a diameter of 350 μm is formed around a hole and, at that time, copper foil hiatuses in a land portion are observed.

6) Anti-migration Properties

Fifty through holes having a diameter of 100 μm or less and having a hole-to-hole distance of 150 μm were independently connected in parallel, and 100 sets of such connections were made. These sets were treated at 130° C. at 85% RH under 1.8 VDC for a predetermined period of time, and then taken out and measured for insulation resistance between the through holes.

7) Insulation Resistance Value After Pressure Cooker Treatment

A circuit having a line/space=70/70 μm was formed, a copper foil surface was treated to form black copper oxide, a prepreg used in each lamination was placed thereon, and the resultant set was laminate-formed. The resultant laminate was treated at 121° C. at 203 kPa, taken out and then treated at 25° C. at 60% RH for 2 hours. 500 VDC was then applied, and 60 seconds after application, resistance was measured.

Example 3

A metal compound powder (SiO2: 57 wt %, MgO: 43 wt %, average particle diameter: 4 μm) was added to a solution of water-insoluble polyester resin having a melting point of 55° C. in methyl ethyl ketone, and these materials were homogeneously mixed and stirred to form a resin solution (126). Resin solution (126) was then applied to one surface of a 50 μm thick polyethylene terephthalate film (128) to form a coating layer (158) having a thickness of 85 μm. The coating layer (158) was dried at 110° C. for 25 minutes to obtain a film-like auxiliary material layer (130) having a metal compound content of 15% by volume.

Separately, one sheet of prepreg (114) as used in Example 1 was provided, 18 μm thick electrolytic copper foil layers (116) were placed on the upper and lower surfaces of the above prepreg (114), and the resultant set was similarly laminate-formed to obtain a double-sided copper-clad laminate (110). Circuits (118) were formed on the front and reverse surfaces of the laminate (110), and then the surfaces were treated to form a black copper oxide layers (120). Then, sheets of the above prepreg (114) were placed on the upper and lower surfaces of the laminate (110), one sheet on the upper surface and one sheet on the lower surface, 7 μm thick electrolytic copper foil layers (122) were placed thereon, and the resultant set was similarly laminate-formed to obtain a four-layered board (124).

Figure 3A:
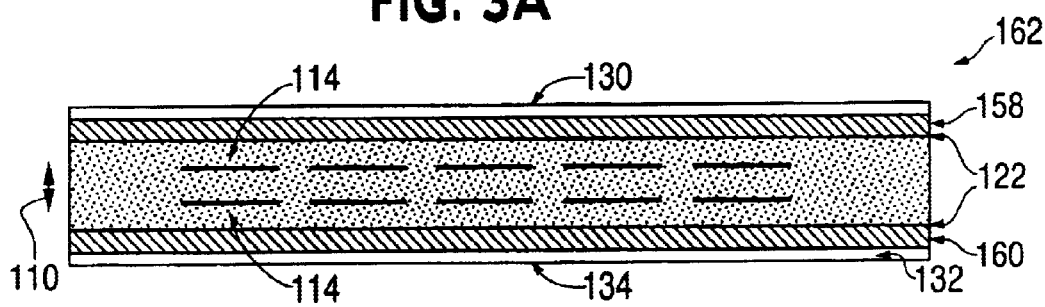
FIG. 3A illustrates a cross-section view of the double-sided copper-clad four-layered board of a preferred embodiment according to Example 3, having an upper surface provided with a film-like auxiliary material, and a lower surface provided with a backup sheet.

Separately, as a backup sheet (134), the above polyester resin solution (126) was applied on one surface of a 50 μm thick aluminum foil layer (132) to form a coating layer (160) having a thickness of 20 μm, and the coating layer (160) was dried to obtain a coating-attached aluminum foil backup sheet (134). The above hole-making auxiliary material layer (130) was disposed on one surface of the four-layered board (124) and the backup sheet (134) was disposed on the other surface of the four-layered board (124) while their resin surfaces faced toward the copper foil sides. The resultant set was laminated at 80° C. at a linear pressure of 1.5 kgf/cm², to obtain a coating-sheet-attached four-layered board (162) having excellent adhesion (FIG. 3A).

Figure 3B:
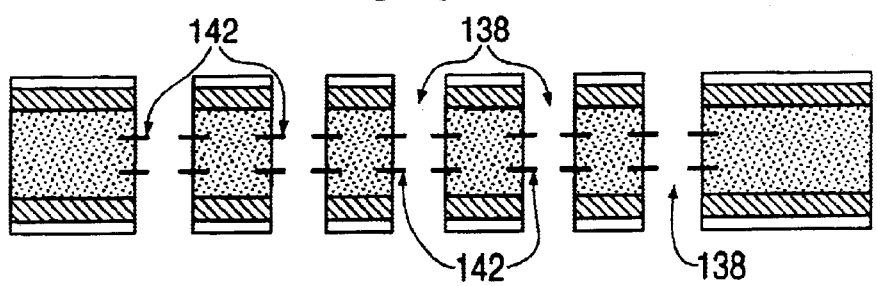
FIG. 3B illustrates a cross-section view of the board of FIG. 3A, having a plurality of penetration holes traversing the board, and copper foil burrs extending from and into the holes.
Figure 3C:
FIG. 3C illustrates a cross-section view of the board of FIG. 3B where the copper foil burrs, the auxiliary material, and the backup sheet, have been removed.
Figure 3D:
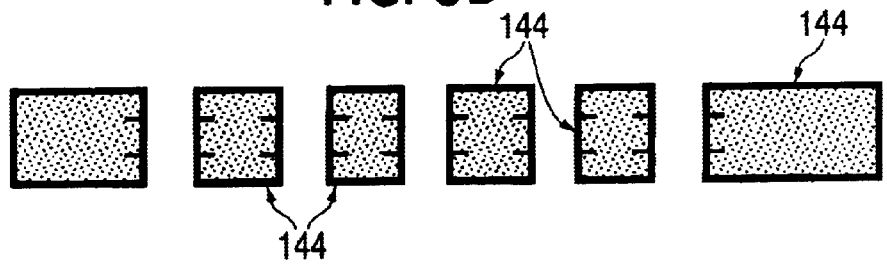
FIG. 3D illustrates a cross-section view of the board of FIG. 3C where the board has been copper plated.

The front surface of the board (162) was irradiated with five pulses from a carbon dioxide gas laser at an output of 35 mJ/pulse to form penetration holes (138) in the board (162) which penetrated through the internal copper foil layers (116) (FIG. 3B). The aluminum foil layer (132) was peeled off while retaining the resin layer (160) on the reverse surface, and an etching solution was passed through the penetration holes (138), at a high rate while retaining the auxiliary sheet (130) on the front surface, to remove copper foil burrs of the surface-copper-foil-layers and of the internal-copper-foil layers (FIG. 3C). Then, the polyester resin layers on the front and reverse surfaces were dissolved in methyl ethyl ketone and removed, then, the resultant board was treated with a potassium permanganate aqueous solution to form a treated board (164). Thereafter, copper plating was carried out to form a copper plating layer (144) in the same manner as in Example 1 (FIG. 3D). Then, the same procedures as those in Example 1 were carried out, to obtain a printed wiring board (154). Table 3 shows the evaluation results for the printed wiring board (154).

TABLE 3

|  | Example 3 |
|---|---|
| Deviation of land copper foils on the front and reverse surfaces (μm) | 0 |
| Deviation of hole positions from the internal layer (μm) | — |
| Pattern breakage and short circuit (number) | 0/200 |
| Copper foil hiatuses around land | Nil |
| Glass transition temperature (° C.) | 235 |
| Through hole and via hole-heat cycle test (%) | |
| 100 cycles | 1.3 |
| 200 cycles | 1.4 |
| 500 cycles | 1.5 |
| Processing time period for making holes (minute) | 16 |

Example 4

12 μm thick electrolytic copper foil layers having an average particle diameter of 0.9 μm were placed on the upper and lower surfaces of two combined prepreg sheets which prepregs were the same as those used in Example 1, and the resultant set was laminate-formed at 200° C. at 20 kgf/cm² under a vacuum of 30 mmHg or less for 2 hours, to obtain a double-sided copper-clad laminate having an insulation layer thickness of 200 μm. Circuits were formed on the front and reverse surfaces of the laminate, copper foil surfaces of the copper foil layers, were treated to form black copper oxide layers. Thereafter, the same prepregs as used in Example 1 were placed on the upper and lower surfaces of the laminate, one on the upper surface and the other on the lower surface, and 7 μm thick electrolytic copper foil layers were placed thereon. The resultant set was laminate-formed under the same conditions as above to obtain a multi-layered board having four layers.

Separately, 800 parts of an aluminum hydroxide powder (average particle diameter 0.9 μm) as a metal compound powder was added to a varnish of water-insoluble carboxyl-group-containing acrylate resin having an acid value of 50 mgKOH/g and a melting point of 65° C. in isopropanol, and these materials were homogeneously stirred and mixed to obtain a varnish. The varnish was applied to one surface of the above multi-layered board to form a varnish coating having a thickness of 50 μm, and the coating was dried at 110° C. for 30 minutes to obtain an auxiliary material layer having a metal compound content of 27% by volume. The above acrylate resin solution was applied on the other surface of the above multi-layered board so as to form a coating having a thickness of 50 μm, and similarly dried to obtain a coating. A 100 μm thick aluminum foil layer was disposed on the outer side of the coating, the auxiliary material layer was irradiated by pulsing once with a carbon dioxide gas laser at an output of 40 mJ/pulse, and thereafter was irradiated by pulsing seven times with the laser at an output of 28 mJ/pulse, to form 900 penetration holes having a diameter of 100 μm each for through holes in each of 70 blocks, 63,000 holes in total, in a 50 mm×50 mm square area.

The aluminum foil layer on the reverse surface was removed, the resin layer of the auxiliary material layer on the front surface was retained as it was, the resultant board was placed in, and treated in, a plasma apparatus, and then a SUEP solution was blown at a high rate to remove copper foil burrs from the front-and-reverse copper foil layers and from internal copper foil layers. The acid resins on the front and reverse surfaces were dissolved and removed with a sodium hydroxide aqueous solution to form a board. After desmear treatment, copper was plated on the resultant board to form a 15 μm thick copper plating layer. Then circuits (200, line/space=70/70 μm) and pads for solder balls, etc., were formed according to a conventional method. Portions other than at least a semiconductor chip portion, a pad portion for bonding and a solder ball pad portion, were coated with a plating resist, and nickel plating and gold plating were carried out to obtain a printed wiring board. Table 4 shows the evaluation results for the printed wiring board.

Example 5

A metal compound powder ($SiO_2$: 57 wt %, MgO: 43 wt %, average particle diameter: 4 μm) was added to a solution of carboxyl-group-containing polyester resin having a melting point of 67° C. and an acid value of 71 mgKOH/g in n-butanol, and these materials were homogeneously mixed and stirred to form a resin solution, and the resin solution was applied to one surface of a 50 μm thick polyethylene terephthalate film to form a coating layer having a thickness of 85 μm. The coating layer was dried at 110° C. for 25 minutes to obtain a film-like auxiliary material layer having a metal compound content of 85% by volume.

Separately, one sheet of the prepreg as used in Example 1 was provided, 18 μm thick electrolytic copper foil layers having an average particle diameter of 0.5 μm, were placed on the upper and lower surfaces of the above prepreg, and the resultant set was laminate-formed to obtain double-sided copper-clad laminate. Circuits were formed on the front and reverse surfaces of the laminate and then the surfaces were treated to form black copper oxide layers. Then, sheets of the above prepreg were placed on the upper and lower surfaces of the laminate, one sheet on the upper surface and one sheet on the lower surface, 3 μm thick electrolytic copper foil layers having a 35 μm thick copper foil carrier attached thereto, were placed thereon, and the resultant set was laminate-formed to obtain a four-layered board.

Separately, the above polyester solution was applied to the reverse surface of the four-layered board and dried to form a coating having a thickness of 50 μm, and a release agent-attached aluminum sheet having a thickness of 100 μm was disposed on the outer side of the coating. The above hole-making auxiliary material was disposed on the front surface of the four-layered board, with the resin side facing toward the copper foil side, and the resultant set was laminated at 100° C. at a linear pressure of 5 kgf/cm, to adhere the aluminum and the auxiliary material to the four-layered board.

The front surface of the board was irradiated with five pulses from a carbon dioxide gas laser at an output of 35 mJ/pulse to form penetration holes in the board which penetrated through the internal copper foil layers. The aluminum foil layer was peeled off while retaining the resin layer on the reverse surface, and an acid etching solution was passed through the penetration holes, at a high rate by suction while retaining the auxiliary sheet on the front surface, to remove copper foil burrs rate by suction while retaining the auxiliary sheet on the front surface, to remove copper foil burrs of the surface-copper-foil-layers and the internal-copper-foil layers. Then the acid polyester resin layers on the front and reverse surfaces were dissolved and removed with a sodium hydroxide aqueous solution. The, the resultant board was then treated with a potassium permanganate aqueous solution. Thereafter, copper plating, etc., was carried out to form a copper plating layer in the same manner as in Example 1, to obtain a printed wiring board. Table 4 shows the evaluation results for the printed wiring board.

TABLE 4

|  | Example 4 | Example 5 |
|---|---|---|
| Deviation of land copper foils on the front and reverse surfaces (μm) | 0 | 0 |
| Deviation of hole positions from the internal layer (μm) | 0 | — |
| Pattern breakage and short circuit (number) | 0/200 | 0/200 |
| Copper foil hiatuses around land | Nil | Nil |
| Glass transition temperature (° C.) | 235 | 235 |
| Through hole-heat cycle test (%) | | |
| 100 cycles | 1.1 | 1.3 |
| 200 cycles | 1.2 | 1.4 |
| 500 cycles | 1.4 | 1.5 |
| Processing time period for making holes (minute) | 24 | 16 |
| Migration resistance (HAST) (Ω) | | |
| Ordinary state | $2 \times 10^{11}$ | — |
| 200 hours | $8 \times 10^8$ | |
| 500 hours | $8 \times 10^8$ | |
| 700 hours | $7 \times 10^8$ | |
| 1000 hours | $7 \times 10^8$ | |

What is claimed is:

1. A method for producing a multi-layered printed wiring board having at least three copper foil layers, which comprises:
   a. providing a stacked assembly comprising: at least a front copper foil layer having a first thickness, a reverse copper foil layer having a first thickness, and an internal copper foil layer provided between said front copper foil layer and said reverse copper foil layer; at least two resin layers alternating between said copper foil layers, to produce said stacked assembly having a top surface and a bottom surface;
   b. providing an auxiliary material for making a hole on said top surface of said stacked assembly and providing a backup sheet comprising a metal sheet and a backup resin layer, on said bottom surface of said stacked assembly such that said backup resin layer is in communication with said bottom surface of said stacked assembly, to form an assembly having a top and a bottom surface;
   c. subjecting said top surface of said assembly to pulsed oscillation from a carbon dioxide gas laser to form at least one through-hole traversing said layers of said assembly, to produce a holed assembly;
   d. reducing said first thickness of said front copper foil layer and said first thickness of said reverse copper foil layer, comprising chemically dissolving an amount of copper from said front copper foil layer and from said reverse copper foil layer of said holed assembly, whereby said first thickness is reduced to provide a second thickness, and
   removing copper foil burrs in communication with said through-hole which burrs extend into or beyond said through-hole, by steps comprising chemically dissolving said copper foil burrs, to produce a cleaned assembly, wherein said steps of thickness reducing and burr removing, are performed simultaneously; and e. plating said cleaned assembly with copper, to produce said multi-layered printed wiring board.

2. The method for producing a multi-layer printed wiring board according to claim 1, wherein said carbon dioxide gas laser has an energy of from 20 to 60 mJ/pulse.

3. The method for producing a multi-layer printed wiring board according to claim 1, wherein said second thickness is from 3 to 7 μm.

4. The method for producing a multi-layer printed wiring board according to claim 1, wherein said auxiliary material comprises a resin composition comprising: 3 to 97% by volume of at least one powder selected from the group consisting of a metal compound powder having a melting point of at least 900° C., a bond energy of at least 300 KJ/mol, and having a carboxyl group in its molecule, a carbon powder, and a metal powder.

5. The method for producing a multi-layer printed wiring board according to claim 4, said resin composition comprising a sheet or a coating.

6. The method for producing a multi-layered printed wiring board according to claim 1, wherein said chemically dissolving, comprises chemically dissolving with an acid etching solution.

7. The method for producing a multi-layer printed wiring board according to claim 1, said backup resin layer comprising a water-soluble resin or an organic solvent-soluble resin.

* * * * *

UNITED STATES PATENT AND TRADEMARK OFFICE
CERTIFICATE OF CORRECTION

PATENT NO. : 6,708,404 B1  
APPLICATION NO. : 09/593494  
DATED : March 23, 2004  
INVENTOR(S) : Morio Gaku et al.

Page 1 of 1

It is certified that error appears in the above-identified patent and that said Letters Patent is hereby corrected as shown below:

In the claims:

Column 23, line 11, insert the following after "composition" --having a carboxyl group in its molecule and--;

Column 23, line 14, insert before "a" --and--; and

Column 24, line 1, delete "and having a carboxyl group in its molecule,".

Signed and Sealed this  
Eleventh Day of January, 2011

David J. Kappos  
*Director of the United States Patent and Trademark Office*